United States Patent
Chung et al.

(10) Patent No.: US 7,948,089 B2
(45) Date of Patent: May 24, 2011

(54) CHIP STACK PACKAGE AND METHOD OF FABRICATING THE SAME

(75) Inventors: Hyun-Soo Chung, Gyeonggi-do (KR); Dong-Ho Lee, Gyeonggi-do (KR); Nam-Seog Kim, Gyeonggi-do (KR); Son-Kwan Hwang, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 203 days.

(21) Appl. No.: 12/100,359

(22) Filed: Apr. 9, 2008

(65) Prior Publication Data
US 2008/0251939 A1  Oct. 16, 2008

(30) Foreign Application Priority Data

Apr. 10, 2007 (KR) ........................ 10-2007-0035176

(51) Int. Cl.
*H01L 23/48* (2006.01)
(52) U.S. Cl. ...................... 257/777; 257/773
(58) Field of Classification Search .................. 257/777, 257/773
See application file for complete search history.

(56) References Cited

U.S. PATENT DOCUMENTS

| | | | | |
|---|---|---|---|---|
| 6,691,696 B2 * | 2/2004 | Akram et al. | ................... | 125/20 |
| 6,731,013 B2 * | 5/2004 | Juso et al. | ..................... | 257/779 |
| 7,326,592 B2 * | 2/2008 | Meyer et al. | .................. | 438/110 |
| 2006/0220262 A1 | 10/2006 | Meyer et al. | | |

FOREIGN PATENT DOCUMENTS

| | | |
|---|---|---|
| JP | 2003-163327 | 6/2003 |
| KR | 2002-0047746 | 6/2002 |
| KR | 10-2005-0021078 | 3/2005 |

OTHER PUBLICATIONS

English language abstract of Japanese Publication No. 2003-163327.
English language abstract of Korean Publication No. 10-2005-0021078.

* cited by examiner

*Primary Examiner* — Douglas M Menz
(74) *Attorney, Agent, or Firm* — Muir Patent Consulting, PLLC

(57) ABSTRACT

A chip stack package is provided, wherein semiconductor chips having different die sizes are stacked by arranging pads in a scribe region through a redistribution process, so that the thickness of the package can be reduced. A method of fabricating the chip stack package is also provided. In the chip stack package, a plurality of circuit patterns are arranged on one surface of a substrate, and a unit semiconductor chip is mounted thereon. The unit semiconductor chip includes a plurality of semiconductor chips sequentially stacked on the substrate. The semiconductor chips of the unit semiconductor chip have different die sizes. One of the semiconductor chips includes a plurality of first pads arranged in a first chip region, and the other semiconductor chips include second pads arranged in a scribe region at an outside of a second chip region defined by the scribe region.

15 Claims, 9 Drawing Sheets

CHIP STACK PACKAGE AND METHOD OF FABRICATING THE SAME

CROSS-REFERENCE TO RELATED PATENT APPLICATION

This application claims priority under 35 USC §119 to Korean Patent Application No. 10-2007-0035176, filed on Apr. 10, 2007 in the Korean Intellectual Property Office, the disclosure of which is incorporated herein in its entirety by reference.

BACKGROUND

1. Technical Field

This disclosure relates to a semiconductor package, and more particularly, to a chip stack package having a reduced thickness, and a method of fabricating the chip stack package.

2. Description of the Related Art

As electronic devices, such as portable personal computers (PCs) and mobile telephones, get smaller and become multifunctional, by virtue of the rapid development of digital technology, they need smaller, lighter and higher capacity semiconductor devices. The integration density of a semiconductor device increases with the capacity of a semiconductor package. To achieve very high integration density, a stack package contains a plurality of stacked semiconductor chips mounted on a printed circuit board, resulting in one unit semiconductor chip package.

FIG. 1 is a cross-sectional view of a conventional chip stack package. Referring to FIG. 1, the chip stack package 100 includes a substrate 110. The substrate 110 includes first and second circuit patterns 111 and 113 respectively arranged on first and second surfaces of the substrate 110. An external connection terminal 120 is positioned on each of the second circuit patterns 113. A unit semiconductor chip 160 is mounted on the first surface of the substrate 110. The unit semiconductor chip 160 includes first and second semiconductor chips 140 and 150. The first semiconductor chip 140 is mounted on the first surface of the substrate 110 by a first adhesive 130, and the second semiconductor chip 150 is stacked on the first semiconductor chip 140 by a second adhesive 135.

The first and second semiconductor chips 140 and 150 are separated from a wafer in chip regions defined by a scribe region. The first and second semiconductor chips 140 and 150 are cut along a scribe line in the scribe region so as to have the same die size. The first semiconductor chip 140 includes first pads 143 arranged at edge portions of an active surface of the first semiconductor chip 140. The second semiconductor chip 150 includes second pads 153 arranged at edge portions of an active surface of the second semiconductor chip 150. The first pads 143 of the first semiconductor chip 140 are electrically connected to the first circuit patterns 111 of the substrate 110 through first wires 170. The second pads 153 of the second semiconductor chip 150 are electrically connected to the first circuit patterns 111 of the substrate 110 through second wires 175. The first and second semiconductor chips 140 and 150, and the first and second wires 170 and 175 are coated with a sealing portion, or encapsulant, 180 for protection from the external environment.

To fabricate the chip stack package 100, the first semiconductor chip 140 is adhered to the substrate 110 by the first adhesive 130, and a primary wire bonding process is performed to electrically connect the first pads 143 of the first semiconductor chip 140 to the first circuit patterns 111 of the substrate 110 through the first wires 170. Subsequently, the second semiconductor chip 150 is adhered to the first semiconductor chip 140 by the second adhesive 135, and a secondary wire bonding process is performed to electrically connect the second pads 153 of the second semiconductor chip 150 to the first circuit patterns 111 of the substrate 110 through the second wires 175.

In the chip stack package 100, a uniform distance must be maintained between the first and second semiconductor chips 140 and 150, due to a loop height of the first wires 170. Therefore, the thickness t1 of the second adhesive 135 between the first and second semiconductor chips 140 and 150 is increased, increasing the overall thickness of the package. In order to reduce the thickness of the package, the thickness of a sealing portion, or encapsulant, is reduced, a wafer is ground to reduce the thicknesses of the semiconductor chips, or a wire bonding method is modified. However, such methods cause warpage of the package or make the package difficult to handle in processing steps.

The process of fabricating the package is complicated, because the first semiconductor chip 140 is adhered to the substrate 110 and a primary wire bonding process is then performed, and the second semiconductor chip 150 is adhered to the first semiconductor chip 140 and a secondary wire bonding process is performed. Such a problem becomes worse as the number of semiconductor chips stacked on the substrate 110 is increased.

SUMMARY

The present invention provides a chip stack package, wherein semiconductor chips having different sizes are stacked by arranging pads in a scribe region through a redistribution process, so that the thickness of the package can be reduced, and a method of fabricating the chip stack package.

According to an aspect of the present invention, there is provided a chip stack package. In the chip stack package, a plurality of circuit patterns are arranged on a first surface of a substrate, and a unit semiconductor chip is mounted on the first surface of the substrate. The unit semiconductor chip includes a plurality of semiconductor chips, each having a plurality of pads on an active surface thereof, sequentially stacked on the first surface of the substrate. The semiconductor chips of the unit semiconductor chip have different die sizes. One of the semiconductor chips includes a plurality of first redistribution pads arranged in a first chip region, and another semiconductor chip includes second redistribution pads arranged in a scribe region at an outside of a second chip region defined by the scribe region. The semiconductor chips of the unit semiconductor chip are electrically connected to the circuit patterns of the substrate through a plurality of connection members. The unit semiconductor chip and the connection members are coated with a sealing portion, or encapsulant.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
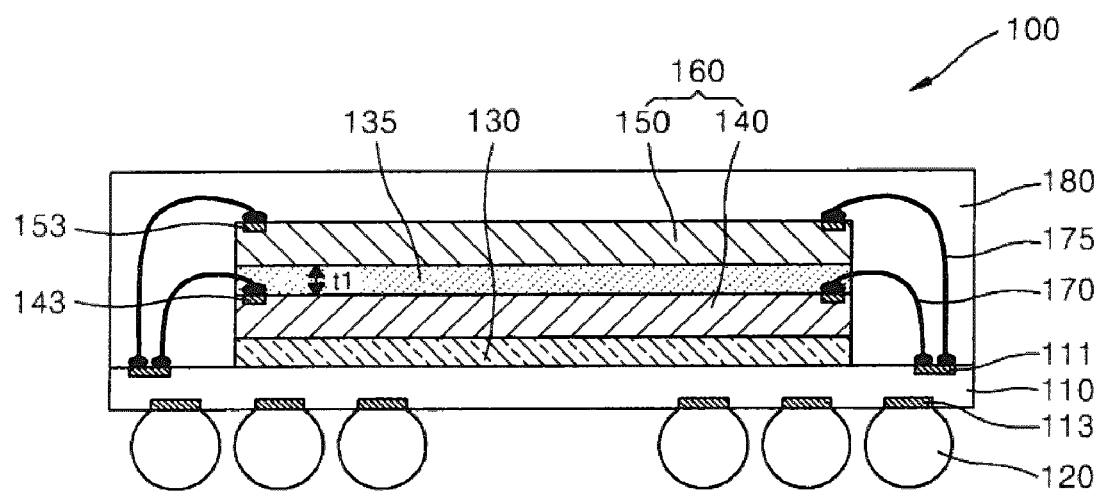
FIG. 1 is a cross-sectional view of a conventional chip stack package.

The present invention will now be described more fully hereinafter with reference to the accompanying drawings, in which preferred embodiments of the invention are shown. This invention may, however, be embodied in many different forms, and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Figure 2:
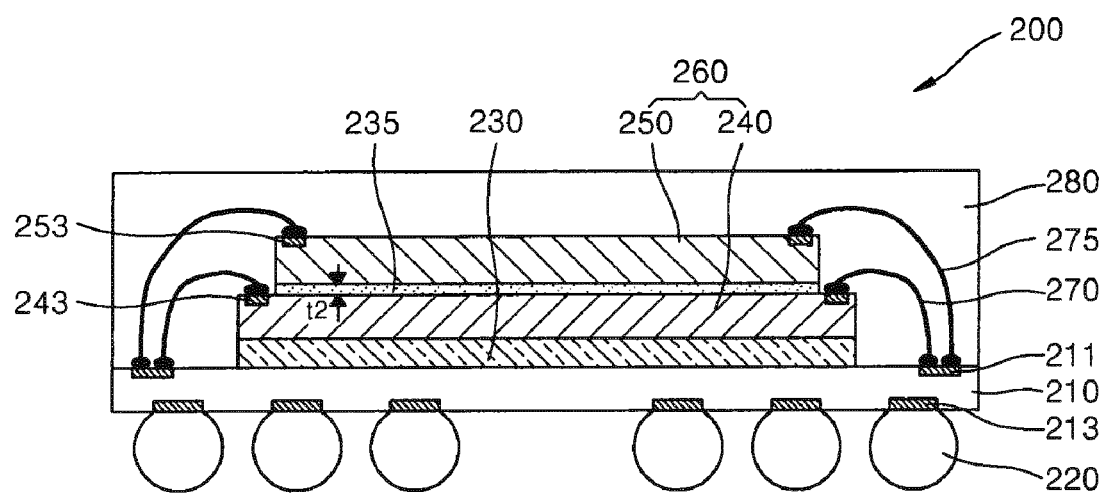
FIG. 2 is a cross-sectional view of a chip stack package according to an embodiment of the present invention.
Figure 3A:
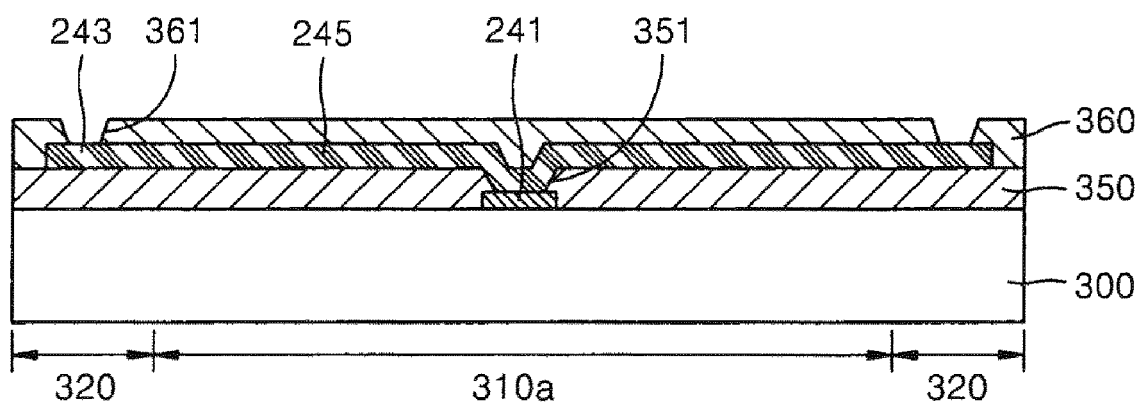
FIGS. 3A and 3B are cross-sectional views of first and second semiconductor chips, respectively, in the chip stack package of FIG. 2.
Figure 3B:
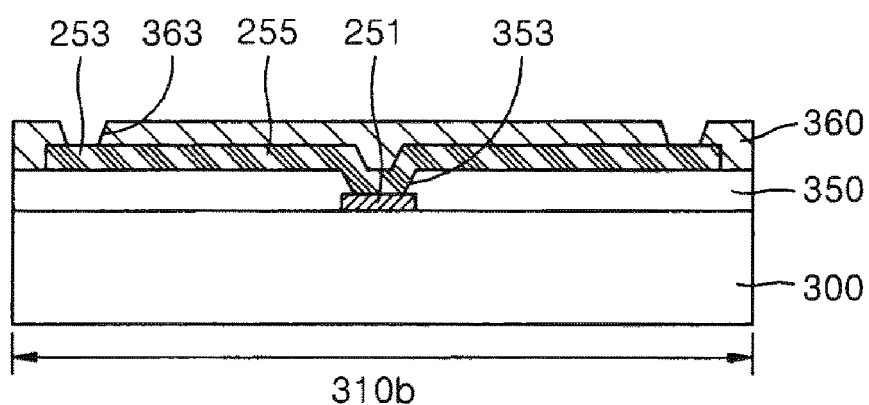

FIG. 2 is a cross-sectional view of a chip stack package according to an embodiment of the present invention. FIGS. 3A and 3B are cross-sectional views of first and second semiconductor chips, respectively, in the chip stack package of FIG. 2. Referring to FIGS. 2, 3A and 3B, the chip stack package 200 includes a substrate 210 and a unit semiconductor chip 260. The substrate 210 may include a printed circuit board (PCB). The substrate 210 includes first and second circuit patterns 211 and 213 respectively arranged on first and second surfaces of the substrate 210. The substrate 210 may further include circuit interconnections (not shown) for electrically connecting the first and second circuit patterns 211 and 213 to each other. A plurality of external connection terminals 220 for electrical connection to the outside of the package are positioned on the second circuit patterns 213. The external connection terminals 220 may include solder balls.

The unit semiconductor chip 260 is mounted on the first surface of the substrate 210. The unit semiconductor chip 260 includes a plurality of semiconductor chips, e.g. first and second semiconductor chips 240 and 250 stacked together. The first and second semiconductor chips 240 and 250 are stacked on the first surface of the substrate 210 such that active surfaces of the first and second semiconductor chips 240 and 250 face upward. The first semiconductor chip 240 is mounted on the substrate 210 by a first adhesive 230, and the second semiconductor chip 250 is stacked on the first semiconductor chip 240 using a second adhesive 235. Here, the active surface of the semiconductor chip refers to a surface on which various kinds of semiconductor devices (not shown) are integrated through a semiconductor fabrication process.

The first semiconductor chip 240 has a larger die size than the second semiconductor chip 250. The first and second semiconductor chips 240 and 250 respectively include first and second pads 243 and 253. Each of the first pads 243 of the first semiconductor chip 240 is positioned on a portion of the first semiconductor chip 240 protruding from a side surface of the second semiconductor chip 250. The first pads 243 of the first semiconductor chip 240 are respectively electrically connected to the first circuit patterns 211 of the substrate 210 through first wires 270, and the second pads 253 of the second semiconductor chip 250 are respectively electrically connected to the first circuit patterns 211 of the substrate 210 through second wires 275.

Since the die size of the second semiconductor chip 250 is smaller, the second semiconductor chip 250 is stacked so as to be distant from the first surface of the substrate 210, and the first and second semiconductor chips 240 and 250 can be stacked regardless of the loop of the first wire 270. For this reason, the thickness t2 of the second adhesive 235 can be as small as possible. The first and second semiconductor chips 240 and 250 and the first and second wires 270 and 275 are coated with a sealing portion, or encapsulant, 280, such as epoxy molding resin, for protection from the external environment.

The first and second semiconductor chips 240 and 250 have a dual die package (DDP) structure. The first pads 243 are arranged at both edge portions of the first semiconductor chip 240 through a redistribution process. Referring to FIG. 3A, a first chip pad 241 is positioned at a substantially central portion of a first chip region 310a on a semiconductor wafer 300, and a first insulating layer 350 having a first opening 351 exposing a portion of the first chip pad 241 is formed on the wafer 300. A first redistribution line 245 electrically connected to the first pad 241 through the first opening 351 is formed on the first insulating layer 350, extending from the first chip region 310a to a scribe region 320. A second insulating layer 360 is formed on the first insulating layer 350 and the first redistribution line 245. Portions of the first redistribution line 245 in the scribe region 320 are exposed by third openings 361 of the second insulating layer 360, to serve as the first pads 243.

The second pads 253 are arranged at both edge portions of the second semiconductor chip 250 through a redistribution process. Referring to FIG. 3B, a second chip pad 251 is positioned at a substantially central portion of a second chip region 310b on a semiconductor wafer 300. A first insulating layer 350 having a second opening 353 exposing a portion of the second chip pad 251 is formed on the wafer 300. A second redistribution line 255 electrically connected to the second chip pad 251 through the second opening 353 is formed on the first insulating layer 350 in the second chip region 310b. A second insulating layer 360 is formed on the first insulating layer 350 and the second redistribution line 255. Portions of the second redistribution line 255 are exposed by fourth openings 363 of the second insulating layer 360, to serve as the second pads 253.

Figure 4A:
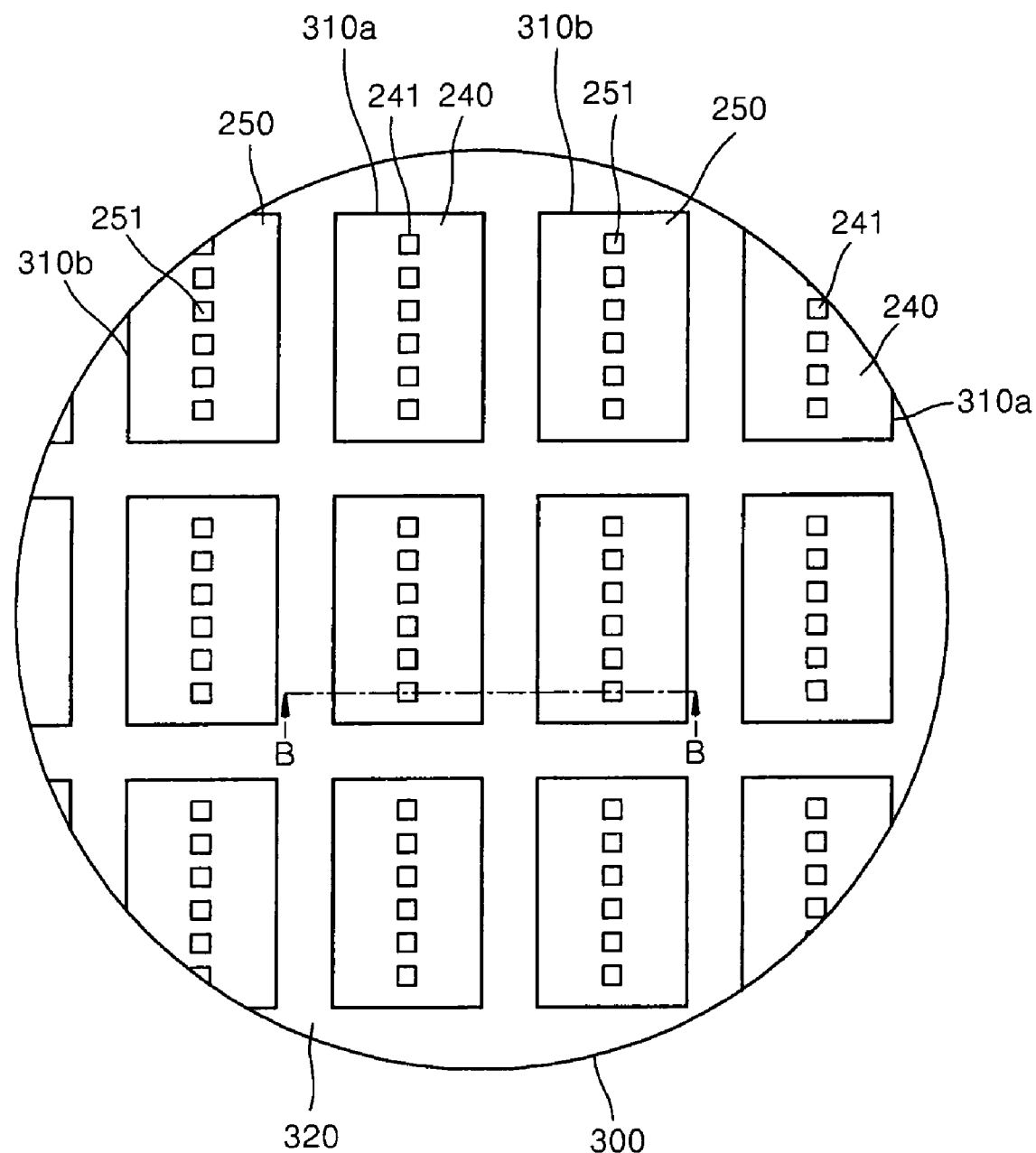
FIGS. 4A and 4B are plan and cross-sectional views, respectively, illustrating a method of fabricating the chip stack package of FIG. 2.
Figure 4B:
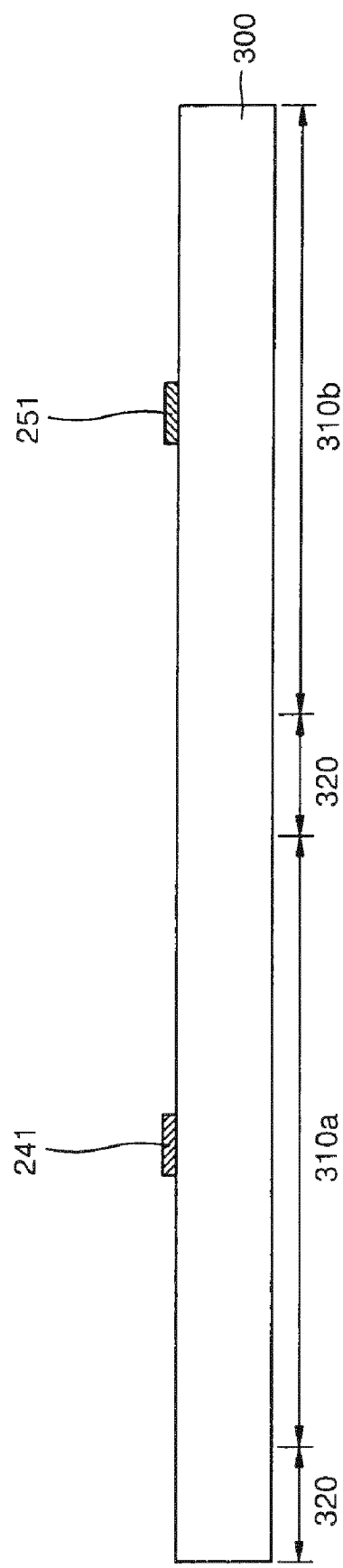
Figure 5A:
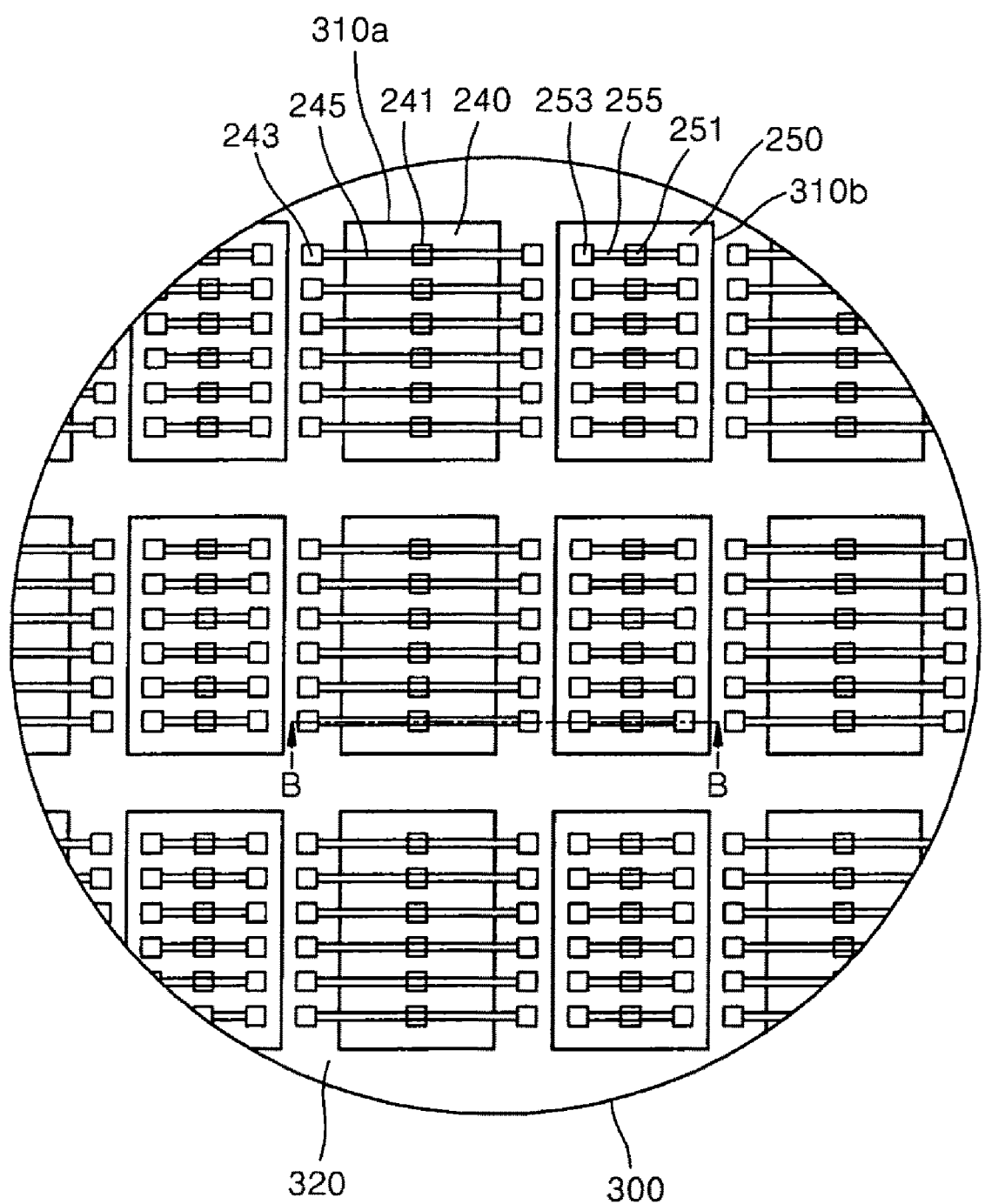
FIGS. 5A and 5B are plan and cross-sectional views, respectively, illustrating the method of fabricating the chip stack package of FIG. 2.
Figure 5B:
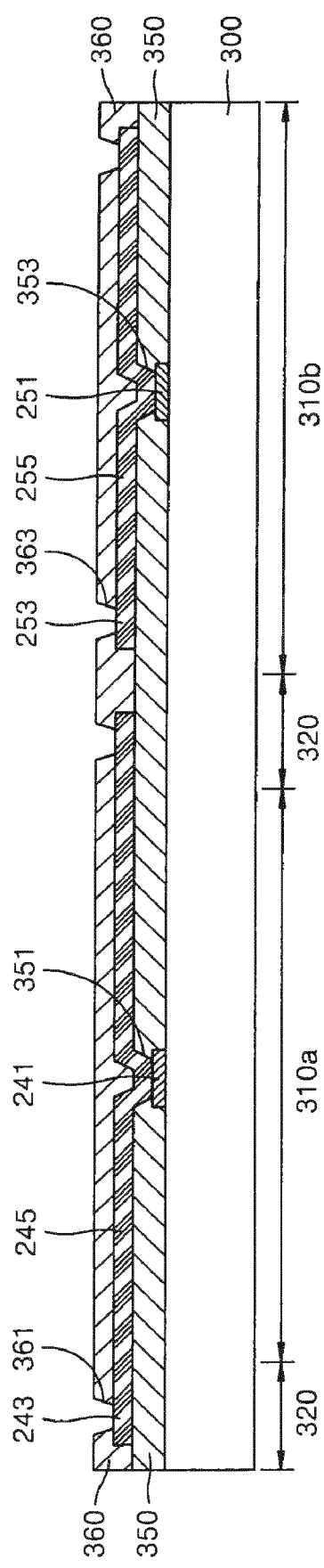
Figure 6A:
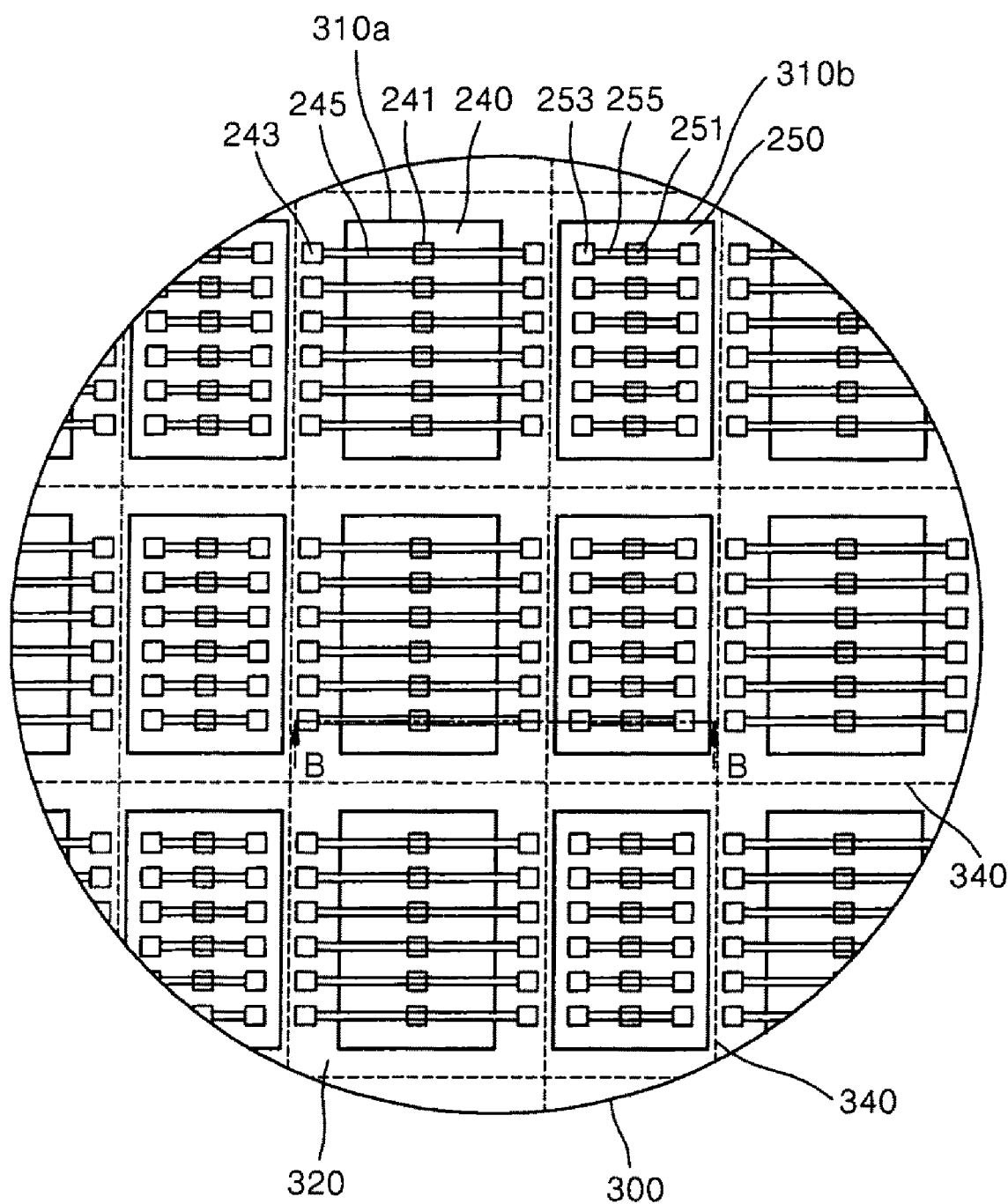
FIGS. 6A and 6B are plan and cross-sectional views, respectively, illustrating the method of fabricating the chip stack package of FIG. 2.
Figure 6B:
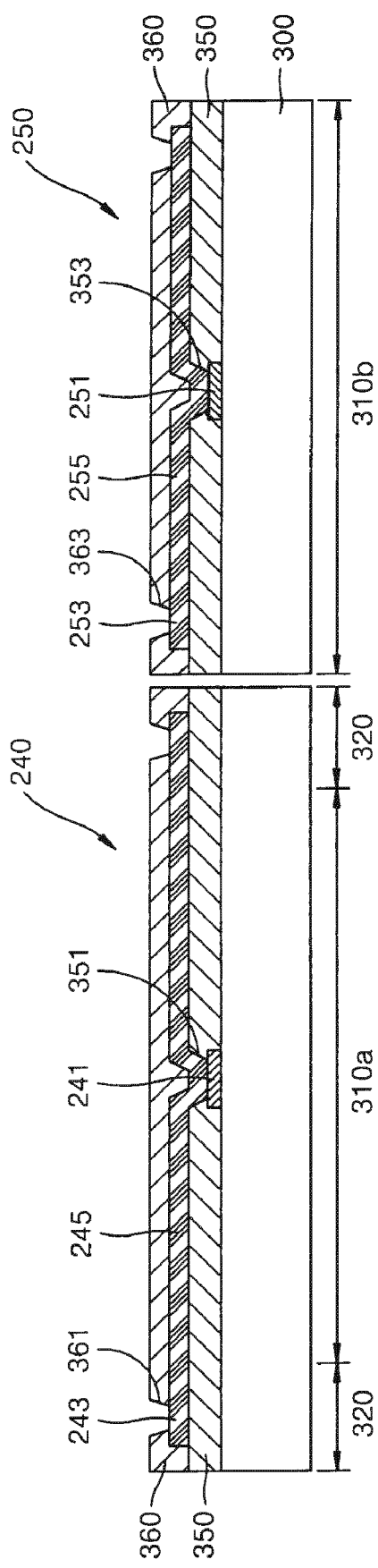

FIGS. 4A, 5A and 6A are plan views illustrating a method of fabricating the chip stack package of FIG. 2. FIGS. 4B, 5B and 6B are cross-sectional views illustrating the method of fabricating the chip stack package of FIG. 2. FIGS. 4B, 5B and 6B are cross-sectional views taken along respective lines B-B in FIGS. 4A, 5A and 6A.

Referring to FIGS. 4A and 4B, a semiconductor wafer 300 is prepared. The semiconductor wafer 300 includes a plurality of chip regions 310a and 310b on which semiconductor devices (not shown) are integrated, and a scribe region 320 defining the chip regions 310a and 310b. The first and second chip regions 310a and 310b are alternately arranged, in which first and second semiconductor chips 240 and 250 will be respectively provided. The semiconductor devices (not shown) are formed on the first and second chip regions 310a and 310b through a semiconductor fabrication process. A plurality of first and second chip pads 241 and 251 are respectively formed in parallel lines at substantially central portions of the first and second chip regions 310a and 310b. Each of the first and second chip pads 241 and 251 is a pad for electrically connecting a semiconductor device to the outside, and may include an aluminum (Al) pad.

Referring to FIGS. 5A and 5B, a first insulating layer 350 is formed on the wafer 300 having the first and second chip pads 241 and 251. The first insulating layer 350 may include a passivation layer. The first insulating layer 350 may be formed of SiO2, Si3N4, phospho-silicate glass (PSG), or the like. A portion of the first insulating layer 350 is etched, thereby forming first and second openings 351 and 353 respectively exposing the first and second chip pads 241 and 251. An interlayer dielectric layer including a polymer-based insulating material may be further formed on the first insulating layer 350.

First and second redistribution lines 245 and 255 are formed on the first insulating layer 350 through a redistribution process. The first redistribution lines 245 are formed on the first insulating layer 350, extending from the first chip region 310a to the scribe region 320, so that the first distribution lines 245 are connected respectively to the first chip pads 241 through the first openings 351. The second redistribution lines 255 are formed on the first insulating layer 350 in the second chip region 310b so as to be respectively connected to the second chip pads 251 through the second openings 353. Each of the first and second redistribution lines 245 and 255 may include a metal such as copper (Cu). Each of the first and second redistribution lines 245 and 255 may also include Ti/Cu/Ni.

A second insulating layer 360 is formed on the first insulating layer 350 having the first and second redistribution lines 245 and 255. The second insulating layer 360 may include an interlayer dielectric layer, e.g., a polymer-based insulating layer. The second insulating layer 360 includes third openings 361 exposing portions of the first redistribution lines 245 and fourth openings 363 exposing portions of the second redistribution lines 255. The third openings 361 expose the portions of the first redistribution lines 245 arranged in the scribe region 320, and the fourth openings 363 expose the portions of the second redistribution lines 255 arranged in the second chip region 310b. The portions of the first redistribution lines 245 exposed by the third openings 361 serve as first pads 243, and the portions of the second redistribution lines 255 exposed by the fourth openings 363 serve as second pads 253. The first pads 243 are arranged in the scribe region 320 at the outside of the first chip region 310a, and the second pads 253 are arranged in the second chip region 310b.

Referring to FIGS. 6A and 6B, the wafer 300 is cut along a scribe line 340 in the scribe region 320, thereby forming the first and second semiconductor chips 240 and 250. The first and second semiconductor chips 240 and 250 are of different sizes. The first semiconductor chip 240 having a large die size is mounted on the substrate 210 by a first adhesive 230, and the second semiconductor chip 250 having a small die size is mounted on the first semiconductor chip 240 by a second adhesive 235, aligned with the first chip region 310a of the first semiconductor chip 240. Thereafter, a wire bonding process is performed only once to electrically connect the first pads 243 of the first semiconductor chip 240 respectively to the first circuit patterns 211 of the substrate 210 through first wires 270, and the second pads 253 of the second semiconductor chip 250 respectively to the first circuit patterns 211 of the substrate 210 through second wires 275. Then, a molding process is performed to coat the first and second semiconductor chips 240 and 250 and the first and second wires 270 and 275 with a sealing portion 280.

Figure 7:
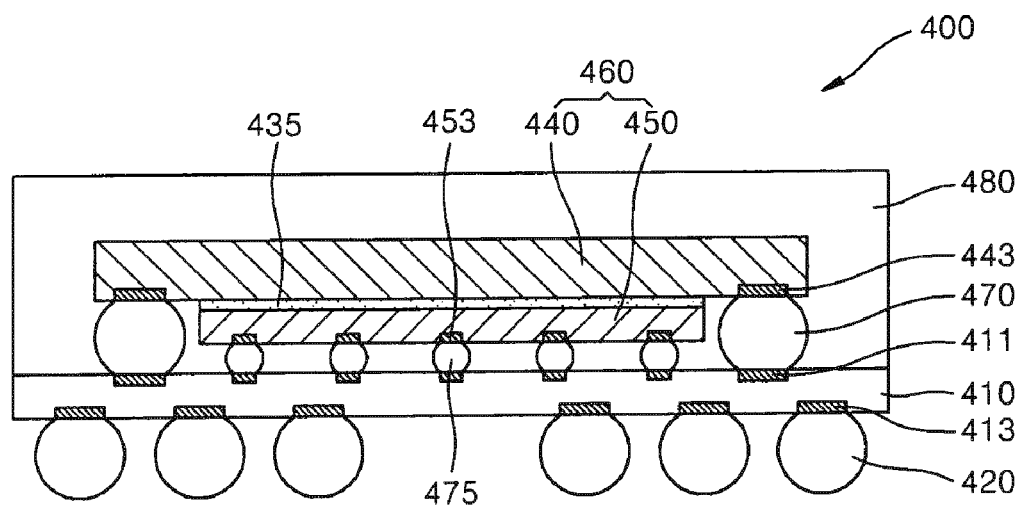
FIG. 7 is a cross-sectional view of a chip stack package according to another embodiment of the present invention.

FIG. 7 is a cross-sectional view of a chip stack package according to another embodiment of the present invention. Referring to FIG. 7, the chip stack package 400 includes a substrate 410 and a unit semiconductor chip 460 mounted thereon. The unit semiconductor chip 460 includes a plurality of semiconductor chips, e.g., first and second semiconductor chips 440 and 450 stacked together. The first and second semiconductor chips 440 and 450 are stacked on a first surface of the substrate 410 such that active surfaces of the first and second semiconductor chips 440 and 450 face the first surface of the substrate 410. According to this embodiment, the first semiconductor chip 440, having a large die size, is adhered by an adhesive 435 to the second semiconductor chip 450, which has a small die size.

First pads 443 of the first semiconductor chip 440 are electrically connected to first circuit patterns 411 of the substrate 410 through first solder balls 470, respectively, and second pads 453 of the second semiconductor chip 450 are electrically connected to first circuit patterns 411 of the substrate 410 through second solder balls 475, respectively. A plurality of second circuit patterns 413 are arranged on a second surface of the substrate 410, and a plurality of external connection terminals 420 for connecting the second circuit patterns 413 to the outside are positioned on the second circuit patterns 413. The first and second semiconductor chips 440 and 450, and the first and second solder balls 470 and 475 are coated with a sealing portion, or encapsulant, 480 for protection from the external environment.

The chip stack package 400 is fabricated through the same method as that illustrated in FIGS. 4A through 6B. However, the process of adhering the first and second solder balls 470 and 475 respectively to the first and second pads 443 and 453 may be further added after the redistribution process of FIGS. 5A and 5B. After having cut a semiconductor wafer into the first and second semiconductor chips 440 and 450, the first circuit patterns 411 of the substrate 410 and the first and second solder balls 470 and 475 of the first and semiconductor chips 440 and 450 are bonded face-to face without using wire bonding.

Figure 8:
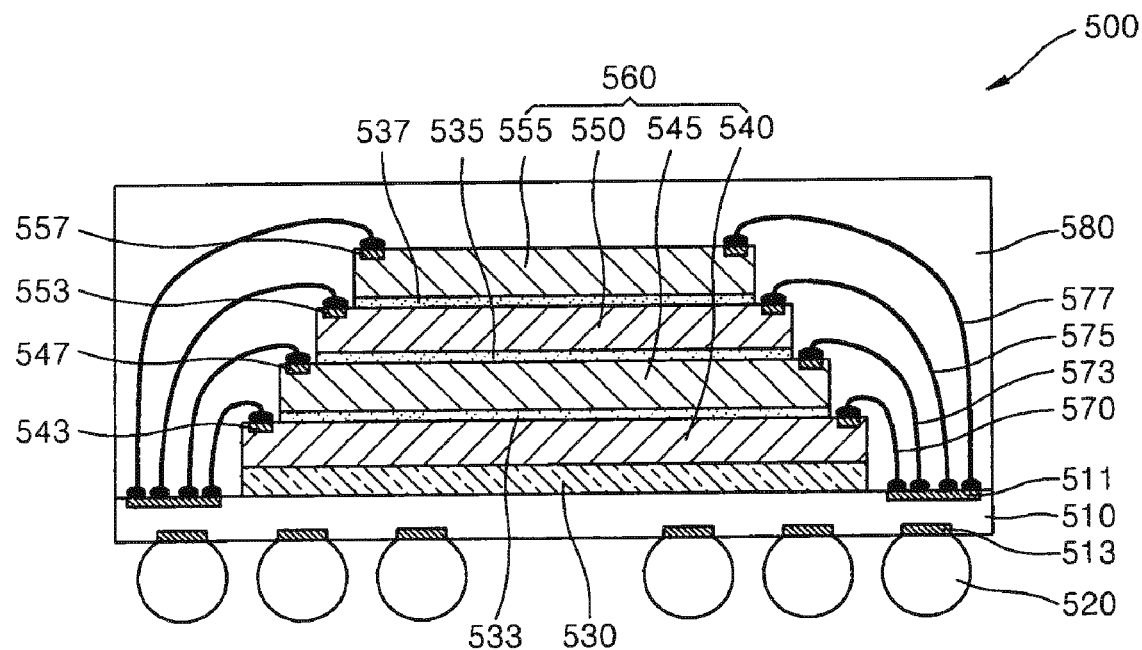
FIG. 8 is a cross-sectional view of a chip stack package according to a further embodiment of the present invention.

FIG. 8 is a cross-sectional view of a chip stack package according to a further embodiment of the present invention. Referring to FIG. 8, the chip stack package 500 includes a substrate 510 and a unit semiconductor chip 560 mounted thereon. The unit semiconductor chip 560 includes a plurality of semiconductor chips, e.g., four semiconductor chips 540, 545, 550 and 555, stacked together. The first through fourth semiconductor chips 540, 545, 550 and 555 are mounted on the substrate 510 using first through fourth adhesives 530, 533, 535 and 537, respectively. First through fourth pads 543, 547, 553 and 557 of the first through fourth semiconductor chips 540, 545, 550 and 555 are electrically connected to first circuit patterns 511 arranged on a first surface of the substrate 510 through first through fourth wires 570, 573, 575 and 577, respectively. The substrate 510 further includes second circuit patterns 513 arranged on a second surface of the substrate 510 and external connection terminals 520 adhered to the second circuit patterns 513. The first through fourth semiconductor chips 540, 545, 550 and 555, and the first through fourth wires 570, 573, 575 and 577 are coated with a sealing portion, or encapsulant, 580 for protection from the external environment.

The chip stack package 500 is fabricated through the same method as that illustrated in FIGS. 4A through 6B. However, the unit semiconductor chip 560 is fabricated such that the fourth pads 557 of the fourth semiconductor chip 555 arranged on the top layer are arranged in a fourth chip region (corresponding to 310b of FIG. 4A), and the first through third pads 543, 547 and 553 of the first through third semiconductor chips 540, 545 and 550 are arranged in a scribe region (corresponding to 320 of FIG. 4A) at the outsides of first through third chip regions (corresponding to 310a of FIG. 4A). Since the sizes of the first through third semiconductor chips 540, 545 and 550 are different from one another, the first and third pads 543, 547 and 553 are arranged in the scribe region 320 so as to sequentially move away from the first chip region 310a.

As described above, according to a chip stack package of the present invention and a method of fabricating the same, semiconductor chips having different sizes are sequentially stacked by redistributing pads in a scribe region without an additional process, so that a wire boding process can be performed regardless of a wire loop height, and thus the thickness of the package can be reduced. Further, all the semiconductor chips can be electrically connected to a substrate through a single wiring process, thereby simplifying the process of fabricating the package.

According to an aspect of the present invention, there is provided a chip stack package. A plurality of circuit patterns are arranged on one surface of a substrate, and a unit semiconductor chip is mounted on the one surface of the substrate. The unit semiconductor chip includes a plurality of semiconductor chips, each having a plurality of pads on an active surface thereof, sequentially stacked on the one surface of the substrate. The semiconductor chips of the unit semiconductor chip have different die sizes. One of the semiconductor chips includes a plurality of first redistribution pads arranged in a first chip region, and the other semiconductor chips include second redistribution pads arranged in a scribe region at an outside of a second chip region defined by the scribe region. The semiconductor chips of the unit semiconductor chip are electrically connected to the circuit patterns of the substrate through a plurality of connection members. The unit semiconductor chip and the connection members are coated with an encapsulant.

The connection members may include wires. The semiconductor chips may be stacked on the first surface of the substrate such that the active surfaces of the semiconductor chips face upward. The semiconductor chips closer to the substrate may have larger die sizes than the semiconductor chips farther from the substrate. The one of the semiconductor chips may be disposed farthest from the substrate. The semiconductor chips may have a dual die package structure. The one of the semiconductor chips may include first chip pads arranged at a substantially central portion of the first chip region; the first redistribution pads arranged at edge portions of the first chip region; and first redistribution lines arranged in the first chip region to electrically connect the first chip pads to the first redistribution pads. The others of the semiconductor chips may include second chip pads arranged at a substantially central portion of the second chip region; the second redistribution pads arranged in the scribe region; and second redistribution lines extending from the second chip region to the scribe region to electrically connect the second chip pads to the second redistribution pads.

The connection members may include solder balls. The semiconductor chips may be stacked on the first surface of the substrate such that the active surfaces of the semiconductor chips face the first surface of the substrate. The semiconductor chips closer to the substrate may have smaller die sizes than the semiconductor chips farther from the substrate. The one of the semiconductor chips may be positioned closest to the substrate.

According to another aspect of the present invention, there is provided a method of fabricating a chip stack package. First, a wafer having a first chip region in which a first semiconductor chip will be fabricated, a second chip region in which a second semiconductor chip will be fabricated, and a scribe region defining the first and second regions are provided. First and second chip pads are arranged respectively at substantially central portions of the first and second chip regions. A redistribution process is performed, thereby forming first redistribution pads connected to the first chip pads through first redistribution lines in the scribe region adjacent to the first chip region, and forming a second redistribution pads connected to the second chip pads through second redistribution lines at edge portions of the second chip region. The wafer is cut along a scribe line in the scribe region, thereby fabricating the first and second semiconductor chips. The first and second semiconductor chips are mounted on one surface of substrate such that the first and second redistribution pads of the first and the second semiconductor chips are electrically connected to circuit patterns arranged on the one surface of the substrate. The first and second semiconductor chips are coated with an encapsulant.

The first and second redistribution pads of the first and second semiconductor chips may be electrically connected to the circuit patterns of the substrate through a wire bonding process. The first semiconductor chip may be adhered to the substrate by a first adhesive, and the second semiconductor chip may be adhered to the first semiconductor chip by a second adhesive.

The first and second redistribution pads of the first and second semiconductor chips may be electrically connected to the circuit patterns of the substrate through a face-to-face bonding process. The fabrication method may further include arranging first and second connection terminals respectively on the first and second redistribution pads between the operations of forming the first and second redistribution pads and cutting the wafer. The second semiconductor chip may be stacked on the one surface of the substrate such that the second redistribution pads are electrically connected to the circuit patterns through the second connection terminals, and the first semiconductor chip may be stacked on the second semiconductor chip such that the first redistribution pads are electrically connected to the circuit patterns through the first connection terminals.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A chip stack package, comprising:
a substrate having a plurality of circuit patterns arranged on a surface thereof;
a unit semiconductor chip mounted on the substrate, the unit semiconductor chip including a plurality of semiconductor chips each having a plurality of pads on an active surface;
a plurality of connection members for electrically connecting the semiconductor chips of the unit semiconductor chip to the circuit patterns of the substrate; and
an encapsulant that encapsulates the unit semiconductor chip and the connection members,
wherein a first semiconductor chip of the plurality of semiconductor chips includes a first homogeneous substrate comprising a first portion of a wafer and having a first size, and a second semiconductor chip of the plurality of semiconductor chips includes a second homogeneous substrate comprising a second portion of the wafer and having a second size larger than the first size, wherein the first and second homogeneous substrates include first and second respective chip regions having the same size, and the second homogeneous substrate includes an additional scribe region not included in the first semiconductor chip; and wherein the first semiconductor chip includes a plurality of first redistribution pads disposed in the first chip region on the first homogeneous substrate and the second semiconductor chip includes a plurality of second redistribution pads disposed in the scribe region on the second homogeneous substrate.

2. The chip stack package of claim 1, wherein the connection members include bonding wires.

3. The chip stack package of claim 2, wherein the semiconductor chips are stacked on the surface of the substrate such that the active surfaces of the semiconductor chips face upward.

4. The chip stack package of claim 3, wherein the semiconductor chips closer to the substrate have larger die sizes and the first one of the semiconductor chips is disposed the farthest from the substrate.

5. The chip stack package of claim 4, wherein the semiconductor chips have a dual die package structure.

6. The chip stack package of claim 5, wherein the first semiconductor chip comprises:
   first chip pads arranged at a substantially central portion of the first chip region;
   the first redistribution pads arranged at edge portions of the first chip region;
   first redistribution lines arranged in the first chip region to electrically connect the first chip pads to the first redistribution pads, and
   the second semiconductor chip comprises:
   second chip pads arranged at a substantially central portion of the second chip region;
   the second redistribution pads arranged in the scribe region; and
   second redistribution lines extending from the second chip region to the scribe region so as to electrically connect the second chip pads to the second redistribution pads.

7. The chip stack package of claim 1, wherein the plurality of semiconductor chips further comprise third and fourth semiconductor chips and wherein three of the first through fourth semiconductor chips include redistribution pads disposed in scribe regions.

8. The chip stack package of claim 1, further comprising a plurality of adhesive layers including a first adhesive layer disposed between the second semiconductor chip and the substrate.

9. The chip stack package of claim 8, wherein the plurality of adhesive layers includes a second adhesive layer disposed between the first semiconductor chip and the second semiconductor chip.

10. The chip stack package of claim 9, wherein a thickness of the second adhesive layer is less than a height of one of the connection members above the active surface of the second semiconductor chip.

11. The chip stack package of claim 1, wherein the first semiconductor chip includes a second scribe region smaller than the scribe region of the second semiconductor chip.

12. The chip stack package of claim 6, wherein the second redistribution lines are longer than the first redistribution lines.

13. The chip stack package of claim 12, wherein the second redistribution lines are disposed on the second homogeneous substrate.

14. A chip stack package, comprising:
   a substrate having a plurality of circuit patterns arranged on a surface thereof;
   a unit semiconductor chip mounted on the substrate, the unit semiconductor chip including a plurality of semiconductor chips each having a plurality of pads on an active surface;
   a plurality of connection members for electrically connecting the semiconductor chips of the unit semiconductor chip to the circuit patterns of the substrate; and
   an encapsulant that encapsulates the unit semiconductor chip and the connection members,
   wherein a first semiconductor chip of the plurality of semiconductor chips includes a first homogeneous substrate having a first size, and a second semiconductor chip of the plurality of semiconductor chips includes a second homogeneous substrate having a second size larger than the first size, wherein the first homogeneous substrate comprises a first portion of a wafer that is cut into semiconductor chips having the first size and semiconductor chips having the second size, and wherein the second homogeneous substrate comprises a second portion of a wafer that is cut into semiconductor chips having the first size and semiconductor chips having the second size,
   wherein the first and second homogeneous substrates include first and second respective chip regions having the same size, and the second homogeneous substrate includes an additional scribe region not included in the first semiconductor chip, and
   wherein the first semiconductor chip includes a plurality of first redistribution pads disposed in the first chip region on the first homogeneous substrate and connected to redistribution lines having a first length, and the second semiconductor chip includes a plurality of second redistribution pads disposed in the scribe region on the second homogeneous substrate and connected to redistribution lines having a second length longer than the first length.

15. The chip stack package of claim 14, wherein the first portion of a wafer and the second portion of a wafer are portions of the same wafer.

* * * * *